(12) United States Patent
Yong et al.

(10) Patent No.: US 10,652,999 B2
(45) Date of Patent: May 12, 2020

(54) MUTUAL INDUCTANCE SUPPRESSOR FOR CROSSTALK IMMUNITY ENHANCEMENT

(71) Applicant: Intel Corporation, Santa Clara, CA (US)

(72) Inventors: Khang Choong Yong, Puchong (MY); Jackson Chung Peng Kong, Tanjung Tokong (MY); Bok Eng Cheah, Bayan Lepas (MY); Stephen H. Hall, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,453

(22) PCT Filed: Oct. 1, 2016

(86) PCT No.: PCT/US2016/055083
§ 371 (c)(1),
(2) Date: Feb. 22, 2019

(87) PCT Pub. No.: WO2018/063416
PCT Pub. Date: Apr. 5, 2018

(65) Prior Publication Data
US 2019/0215953 A1 Jul. 11, 2019

(51) Int. Cl.
*H05K 1/02* (2006.01)
(52) U.S. Cl.
CPC ......... *H05K 1/0228* (2013.01); *H05K 1/0225* (2013.01); *H05K 1/0253* (2013.01); *H05K 1/0296* (2013.01); *H05K 2201/093* (2013.01)
(58) Field of Classification Search
CPC ....................... H05K 1/0228; H05K 2201/093
(Continued)

(56) References Cited

U.S. PATENT DOCUMENTS 6,380,818 B1 * 4/2002 Lee ........................... H01P 3/08
333/1
6,433,648 B1 * 8/2002 Lee ........................ H01L 23/642
333/1
(Continued)

FOREIGN PATENT DOCUMENTS

| JP | 2003-258394 | 9/2003 |
|---|---|---|
| JP | 2004-201000 | 7/2004 |
| JP | 2010-062516 | 3/2010 |

OTHER PUBLICATIONS

International Search Report and Written Opinion for International Patent Application No. PCT/US2016/055083 dated May 23, 2017, 10 pgs.
(Continued)

*Primary Examiner* — Sherman Ng
(74) *Attorney, Agent, or Firm* — Schwabe, Williamson & Wyatt, P.C.

(57) ABSTRACT

Embodiments are generally directed to a mutual inductance suppressor for crosstalk immunity enhancement. An embodiment of a printed circuit board includes a first signal trace and a second signal trace on a first layer, wherein the first signal trace and second signal trace are non-intersecting; a second layer below the first layer, the second layer including a voltage reference plane; and a mutual inductance suppressor in the voltage reference plane, the mutual inductance suppressor including a serpentine portion of the voltage reference plane between the first signal trace and the second signal trace.

25 Claims, 8 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 6,624,729 | B2* | 9/2003 | Wright | H01P 3/081 |
| | | | | 333/238 |
| 8,294,529 | B2 | 10/2012 | Kim | |
| 2007/0040634 | A1* | 2/2007 | Kanno | H01P 3/081 |
| | | | | 333/238 |
| 2007/0236303 | A1* | 10/2007 | Lee | H01P 3/081 |
| | | | | 333/1 |
| 2010/0207700 | A1* | 8/2010 | Park | H01P 3/081 |
| | | | | 333/1 |
| 2013/0127559 | A1* | 5/2013 | Lin | H04B 3/32 |
| | | | | 333/1 |
| 2014/0177150 | A1 | 6/2014 | Oluafemi et al. | |
| 2015/0130553 | A1 | 5/2015 | Enriquez Shibayama et al. | |

OTHER PUBLICATIONS

International Preliminary Report on Patentability for International Patent Application No. PCT/US2016/055083 dated Apr. 11, 2019, 7 pgs.

* cited by examiner

| 10 inch Microstrip | Z(@1GHz) | IL(@1GHz) | NEXT (@1GHz) | FEXT (@1GHz) | |
|---|---|---|---|---|---|
| [100] | 44.46 Ω | -2.731 dB | -31.45 dB | -14.83 dB | |
| [200] | 43.50 Ω ↔ | -2.238 dB ↓ | -44.96 dB ↓ | -27.25 dB ↓ | ✓ |

MUTUAL INDUCTANCE SUPPRESSOR FOR CROSSTALK IMMUNITY ENHANCEMENT

CROSS-REFERENCE TO RELATED APPLICATION

This patent application is a U.S. National Phase Application under 35 U.S.C. § 371 of International Application No. PCT/US2016/055083, filed Oct. 1, 2016, entitled "MUTUAL INDUCTANCE SUPPRESSOR FOR CROSSTALK IMMUNITY ENHANCEMENT," which designates the United States of America, the entire disclosure of which is hereby incorporated by reference in its entirety and for all purposes.

TECHNICAL FIELD

Embodiments described herein generally relate to the field of electronic devices and, more particularly, a mutual inductance suppressor for crosstalk immunity enhancement.

BACKGROUND

In the operation of electronic devices, which are continuing to be reduced in size while also being operated at higher speeds, crosstalk noise is an increasing problem. In particular, far-end crosstalk is generally associated with microstrip (MS) routing configuration in printed circuit board (PCB) design. Far-end crosstalk (FEXT) refers to interference at a far end of a circuit, while near-end crosstalk (NEXT) refers to crosstalk at a near-end of the circuit.

As signaling speed increases with every new generation of high-speed input/output (I/O) interfaces, crosstalk noise has become an increasingly significant factor in constraining the physical aspects of PCB design, such as shorter lengths that are supportable and additional PCB layer counts.

Conventional solutions to mitigate FEXT include allocating more lane-to-lane spacing to minimize crosstalk coupled from one signal lane to adjacent one. However, the drawback of the conventional approach is that more PCB real estate is needed, thus requiring a larger system form-factor, and thus interfering with miniaturization efforts.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to a mutual inductance suppressor for crosstalk immunity enhancement.

For the purposes of this description, the following apply:

"Crosstalk" refers to a signal on one signal channel causing an undesired effect on another signal channel due to inductive coupling or capacitive coupling between such channels. Far-end crosstalk (FEXT) refers to interference at a far end of a circuit, while near-end crosstalk (NEXT) refers to crosstalk at a near-end of the circuit.

Conventional solutions to mitigate far-end crosstalk on PCB signal traces include allocating more lane-to-lane spacing to minimize crosstalk coupled from one signal lane to an adjacent signal. However, the drawback to increasing signal line spacing is an increase in the amount of PCB real estate needed, thus requiring a larger system form-factor.

Alternatively, instead of using microstrip routing, a system may utilize stripline (SL) or dual-stripline (DSL) routing, wherein signal routes are located at the inner layers of PCB.

However, this translates to an increase in layer counts, which thus results in an increase in Z-height for an electronic device such as a computing device, which thus further limit the overall system design in that may be achieved in technologies such as in 2-in-1 computing systems.

In some embodiments, an apparatus, system, or process provides for a mutual inductance suppressor in a voltage reference plane, for example ground (Vss) or power (Vcc) reference plane, for crosstalk reduction. In some embodiments, the mutual inductance suppressor includes a serpentine shaped path of the voltage reference plane structure.

In some embodiments, the mutual inductance suppressor may be utilized in common circuit board structures, but is also applicable for flexible printed circuit boards (FPCs) and flexible printed cables as the mutual inductance suppressor may be implemented in a flexible conductive material as well as a solid conducting structure.

Figure 1A:
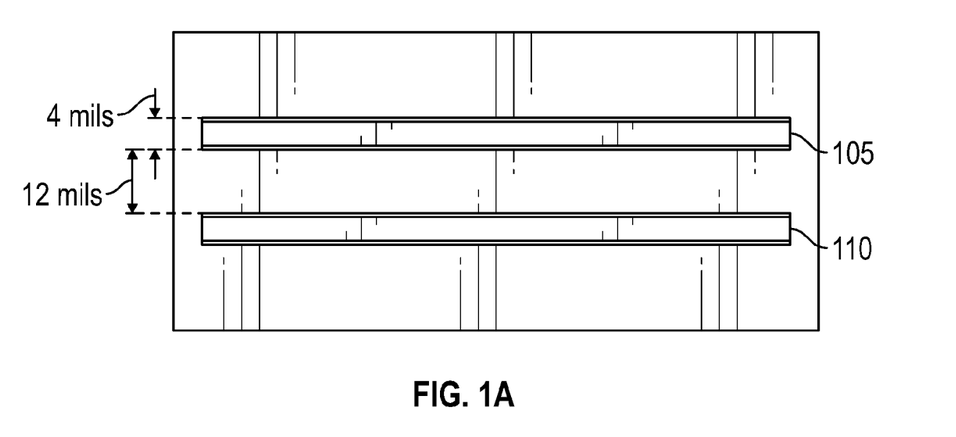
FIGS. 1A and 1B illustrate a transmission line with conventional voltage reference plane structure.
Figure 1B:
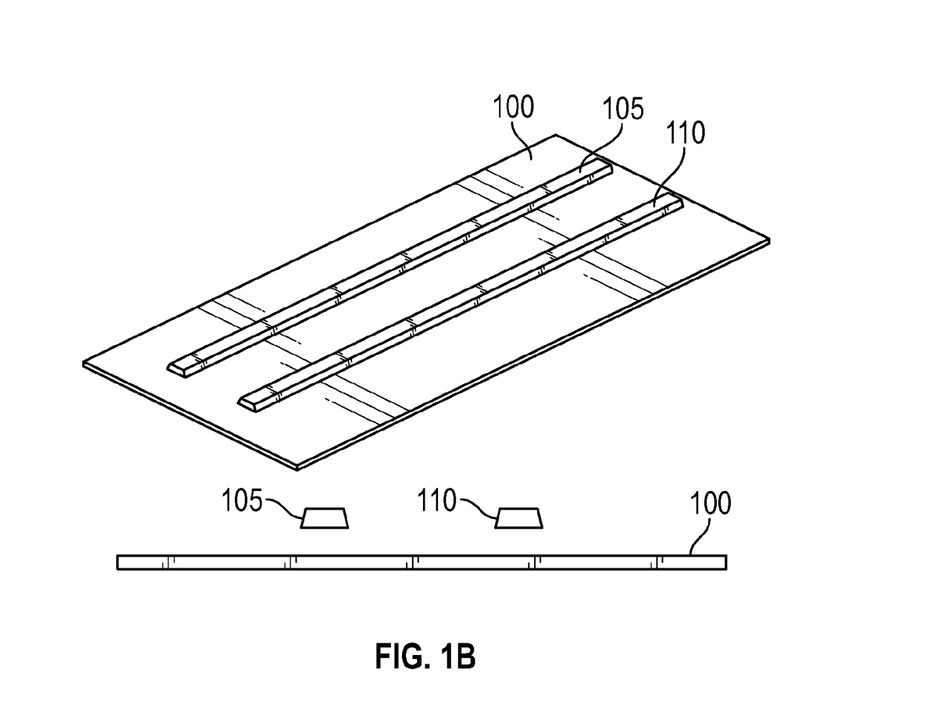

FIGS. 1A and 1B illustrate a transmission line with conventional voltage reference plane structure. As illustrated in FIG. 1A, in transmission line structure with a conventional voltage reference plane, for example a ground reference plane structure or other reference voltage plane, the voltage reference plane structure having conventional microstrip routing without any intervening mutual inductance suppressor, there is a first signal line (or lane or trace) 105 and a second signal line 110 above a voltage reference plane 100. In this structure, the mutual inductances are between the lines, $L_{12}$, and the self-inductance between each of the lines 105-110 and the voltage reference plane 100 below, $L_{11}$ (between the first line and the voltage reference plane) and $L_{22}$ (between the second line and the voltage reference plane).

Figure 2A:
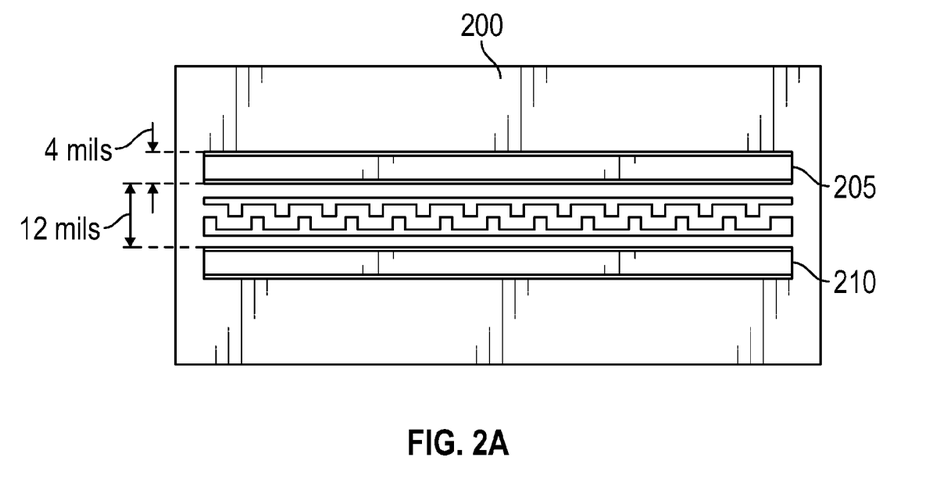
FIGS. 2A and 2B illustrate a transmission line with a mutual inductance suppressor voltage reference plane structure.
Figure 2B:
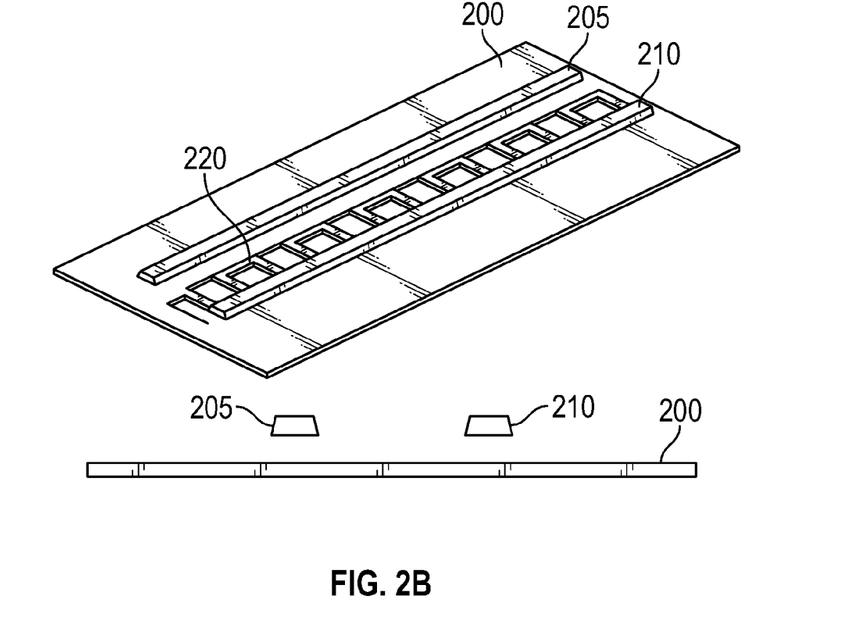

FIGS. 2A and 2B illustrate a transmission line with a mutual inductance suppressor voltage reference plane structure. As illustrated in FIG. 2A, in an embodiment of a voltage reference plane structure with mutual inductance suppressor, there is a first signal line (or lane or trace) 205 and a second signal line 210 above a voltage reference plane 200. In some embodiments, the voltage reference plane 200 that is associated with a reference voltage, for example ground potential voltage (Vss) or power or supply voltage potential (Vcc), includes a serpentine path 220 within the voltage reference plane between the traces, and thus between the signal conductors' current return plane. The serpentine path functions as a mutual inductance (Lm) suppressor suppressing the resultant magnetic field coupling between the conductors to enhance the crosstalk immunity.

Figure 3A:
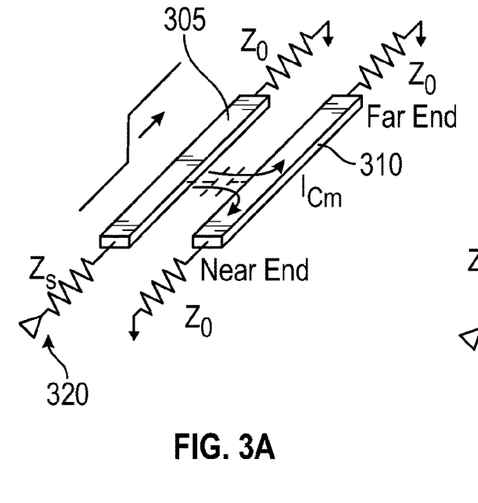
FIGS. 3A and 3B are illustrations of coupled currents on a victim line summing producing near-end and far-end crosstalk noise.
Figure 3B:
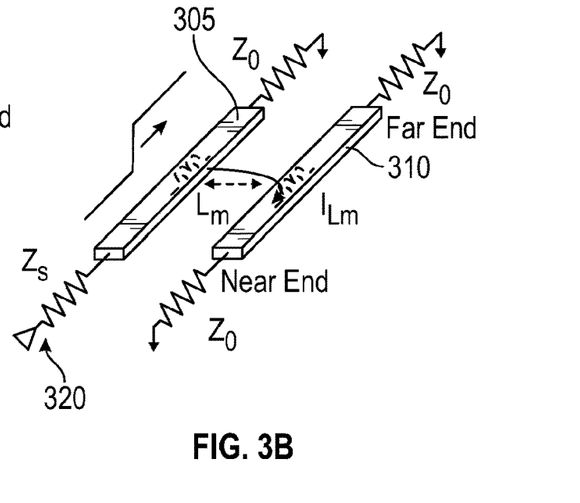

FIGS. 3A and 3B are illustrations of coupled currents on a victim line summing producing near-end and far-end crosstalk noise. FIGS. 3A and 3B illustrate the formation of coupled currents and thus crosstalk between two adjacent signal lines, the coupled lines being illustrated as a first signal line 305 (commonly referred to as the aggressor line) with driver 320 driving a signal, and a coupled second line 310 (commonly referred to as the victim line) receiving crosstalk. In general the first signal line and second signal line are non-intersecting lines, and may be parallel with each other at least in part.

The induced current and voltage are the following:

$$I_{Cm} = C_m \frac{dV}{dt} \quad [1]$$

$$V_{Lm} = L_m \frac{dI}{dt} \quad [2]$$

Further, the current totals for the near end and far end are the following:

$$I_{near} = I_{Cm} + I_{Lm} \quad [3]$$

$$I_{far} = I_{Cm} + I_{Lm} \quad [4]$$

The crosstalk noise is largely ascribed to the electromagnetic fields, the electric field (E) and magnetic field (H), as associated with the mutual capacitance ($C_M$) and mutual inductance ($L_M$) respectively.

Fundamentally, crosstalk is caused by mutual inductances (Lm) and mutual capacitances (Cm) between conductors. These two phenomena couple energy via magnetic and electric field interaction between conductors, and the forward crosstalk (FEXT) and the backward crosstalk (NEXT) are described by the equations [5] and [6].

$$FEXT = \frac{1}{2}(K_C - K_L)\frac{l}{v_p}\frac{v}{t_r} \quad [5]$$

$$NEXT = \frac{K_C - K_L}{4}\left[v_1(t) - v_1\left(\frac{2-2l}{v_p}\right)\right] \quad [6]$$

where $K_C \equiv \frac{C_M}{C_g + C_M}$ and $K_L \equiv \frac{L_M}{L_0}$

In some embodiments, to reduce both FEXT and NEXT, the basic principle is to suppress Lm, while maintaining the self-inductance (L0), capacitance to ground (Cg), and Cm unchanged, wherein L0 and Cg are maintained to preserve the characteristic impedance (Z0), and Cm is maintained to ease FEXT and NEXT suppression thru Lm.

This principle can be verified by examining the propagation delay (VP) for the structure 100 in FIGS. 1A-1B and the structure 200 in FIGS. 2A and 2B.

$$Z_{0,isolated} = \sqrt{\frac{L_0}{C_g + C_M}} \quad [7]$$

$$Z_{0,even} = \sqrt{\frac{L_0 + L_M}{C_g}}$$

$$Z_{0,odd} = \sqrt{\frac{L_0 - L_M}{C_g + 2C_M}}$$

$$v_{p,isolated} = \frac{1}{\sqrt{L_0(C_g + C_M)}} \quad [8]$$

$$v_{p,even} = \frac{1}{\sqrt{(L_0 + L_M)C_0}}$$

$$v_{p,odd} = \frac{1}{\sqrt{(L_0 - L_M)(C_g + 2C_M)}}$$

As described by equations [7] and [8], if Lm suppression line structure 200 exhibits lower Lm as compared to the conventional line with comparable L0, Cg, and Cm:

(a) $v_{p,isolated}$ for conventional structure 100 and Lm suppressor structure 200 will be similar in isolated mode;

(b) $v_{p,odd}$ for Lm suppressor structure 200 will be slower than the conventional structure 100 in odd mode, (c) $v_{p,even}$ for Lm suppressor structure 200 will be faster than the conventional structure 100 in even mode.

Figure 4:
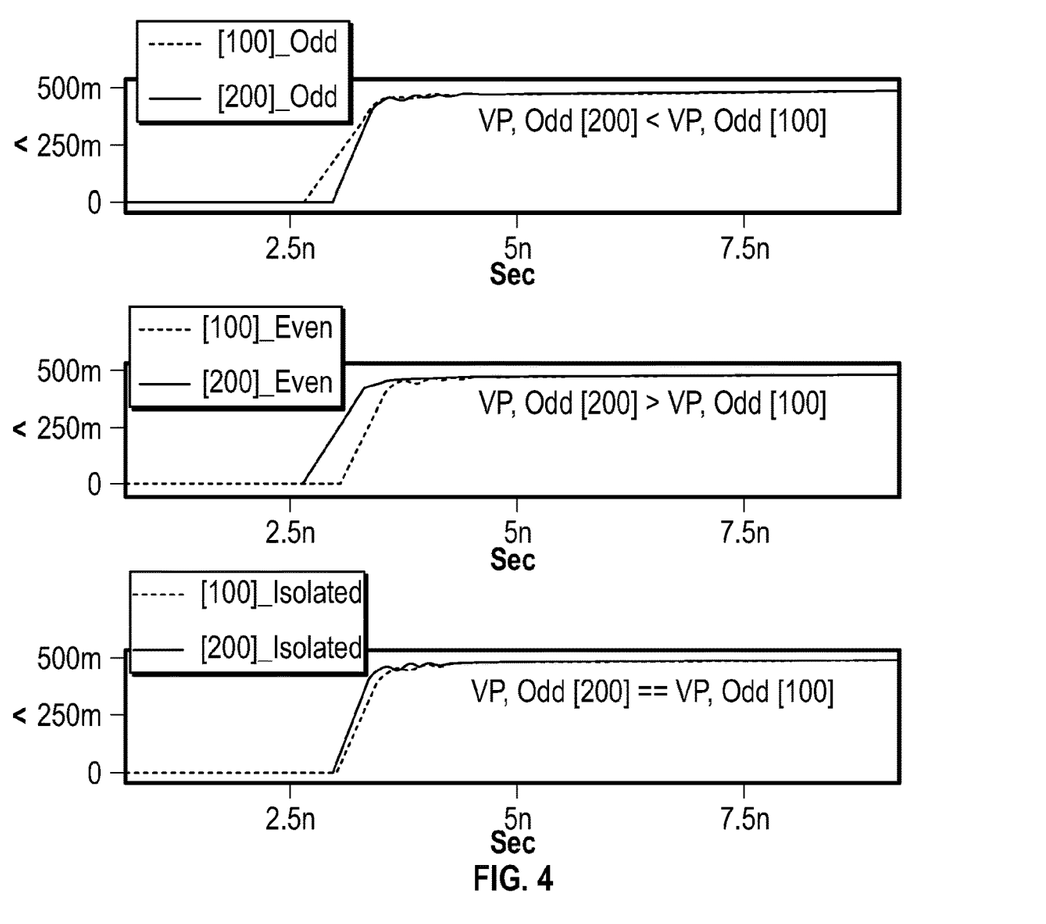
FIG. 4 is an illustration of timing diagrams for propagation of signals over transmission lines with certain voltage reference plane structures; Figure SA is an illustration of voltage reference plane structures according to an embodiment.

FIG. 4 is an illustration of timing diagrams for propagation of signals over transmission lines with certain voltage reference plane structures. The time diagrams confirm that $v_{p,isolated}$ for conventional voltage reference plane structure 100 and Lm suppressor voltage reference plane structure 200 will be similar in isolated mode; $v_{p,odd}$ for Lm suppressor voltage reference plane structure 200 will be slower than the conventional structure 100 in odd mode; and $v_{p,even}$ for Lm suppressor structure 200 will be faster than the conventional structure 100 in even mode.

Figure 5A:
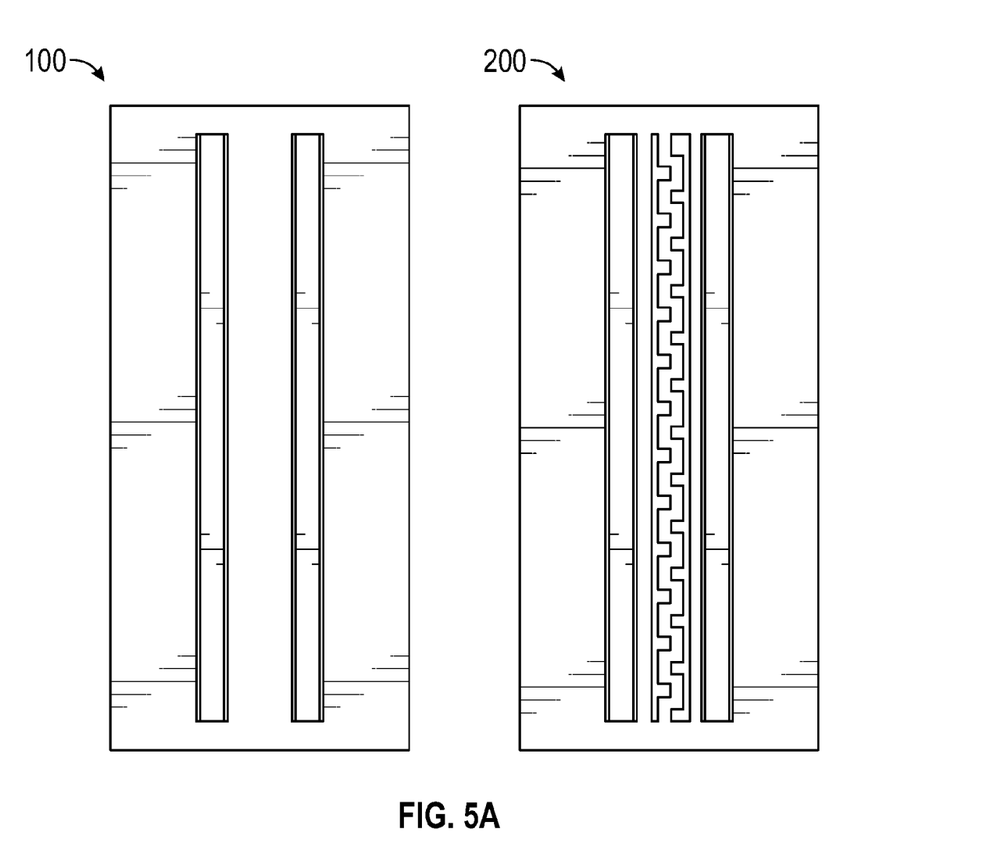

FIG. 5A is an illustration of voltage reference plane structures according to an embodiment. FIG. 5A illustrates a conventional voltage reference plane structure (case 100), without any mutual inductance suppressor between signal traces; and an embodiment of an Lm suppressor voltage reference plane structure (200) including a serpentine path between signal traces.

Figure 5B:
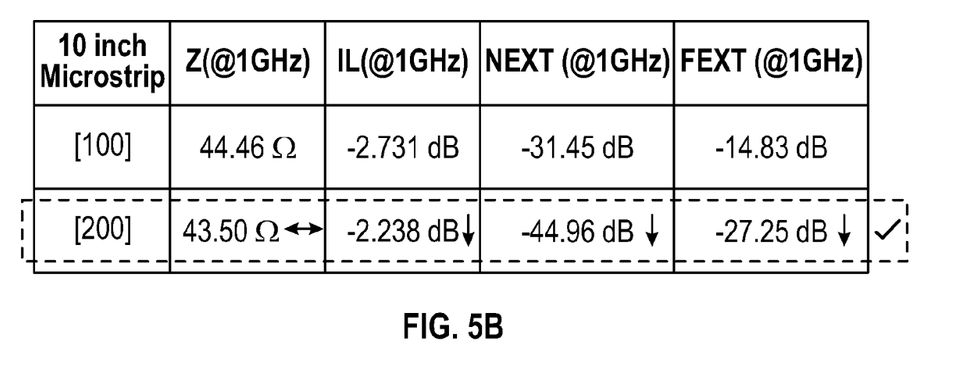
FIG. 5B illustrates S-parameter and TDR results for a comparison of voltage reference plane structures according to an embodiment.

In some embodiments, as compared to a conventional microstrip transmission line with solid voltage reference plane 100, the microstrip with Lm-suppressor voltage reference plane structure 200 operates to significantly reduce the NEXT and FEXT, with reductions potentially being greater than 40%, with comparable IL (insertion loss, the loss resulting from insertion of an element in a transmission line) and Z0 (characteristic impedance) as depicted in the following results:

FIG. 5B illustrates S-parameter and TDR (time domain reflectometry) results for a comparison of voltage reference plane structures according to an embodiment. The comparison shows the Lm-suppressor voltage reference plane structure 200 providing improvement in NEXT and FEXT (~−13 dB reduction) with comparable insertion loss and characteristic impedance.

Figure 5C:
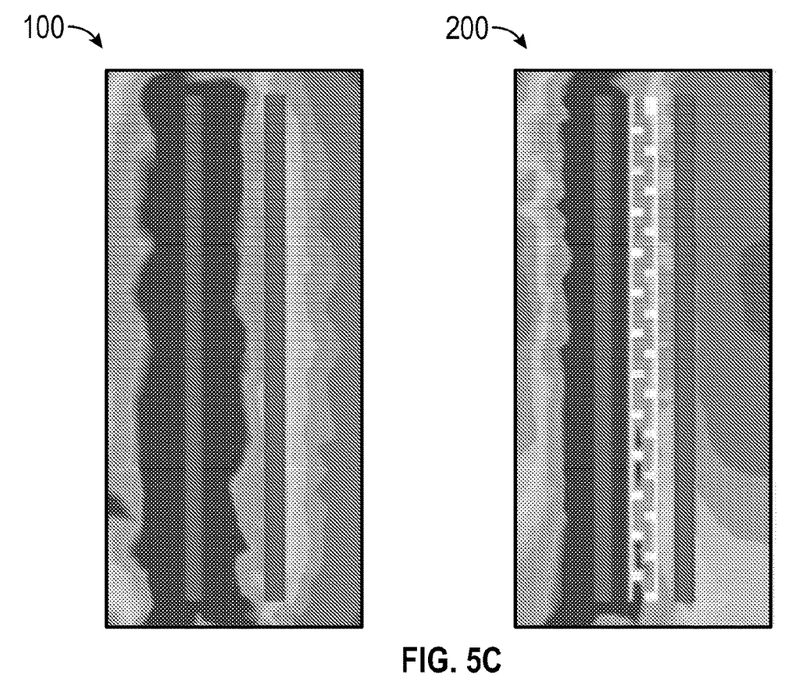
FIG. 5C illustrates current density on voltage reference plane structures according to an embodiment.

FIG. 5C illustrates current density on voltage reference plane structures according to an embodiment. In this illustration, the current density at 1 GHz on the voltage reference plane, with the return current density directly beneath the signal conductor in the Lm suppressor voltage reference plane structure 200 being relatively more dense/concentrated and less spread out to the adjacent signal conductor. This result implies that resultant fringing magnetic field coupled to the victim line is relatively lower in 200 as compare to 100.

Figure 5D:
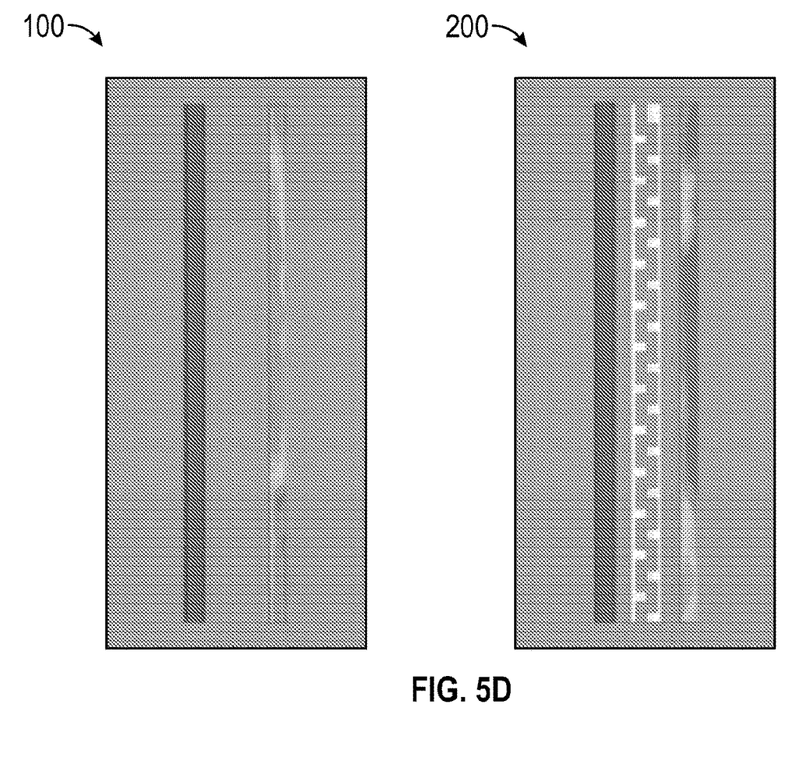
FIG. 5D illustrates current density on victim lines in a comparison of voltage reference plane structures according to an embodiment.

FIG. 5D illustrates current density on victim lines in a comparison of voltage reference plane structures according to an embodiment. In this illustration, the current density at 1 GHz on the victim line with 1V of signal excited at the aggressor line. The current density on the victim line in the Lm suppressor voltage reference structure 200 is relatively lower in comparison with 100, demonstrating that the amount of crosstalk noise induced on the victim line in the Lm suppressor voltage reference structure 200 is relatively less than the compared structure 100.

In some embodiments, an Lm-suppressor comprises a set or multiple sets of a serpentine structure on the reference plane located on the bottom, top, or same layer of the conductors and is placed between the conductors, where the conductors are nonintersecting.

In some embodiments, the Lm suppressor may be introduced on the voltage reference plane, i.e. a solid serpentine deposited on top of or build up upon the voltage reference plane, and hence reference plane voiding may not be present.

In some embodiments, in order to suppress both the NEXT and FEXT without affecting the line impedance Z0, the serpentine structure need to be tuned such that the net Lm is reduced while L0, Cm, Cg are maintained.

Figure 6:
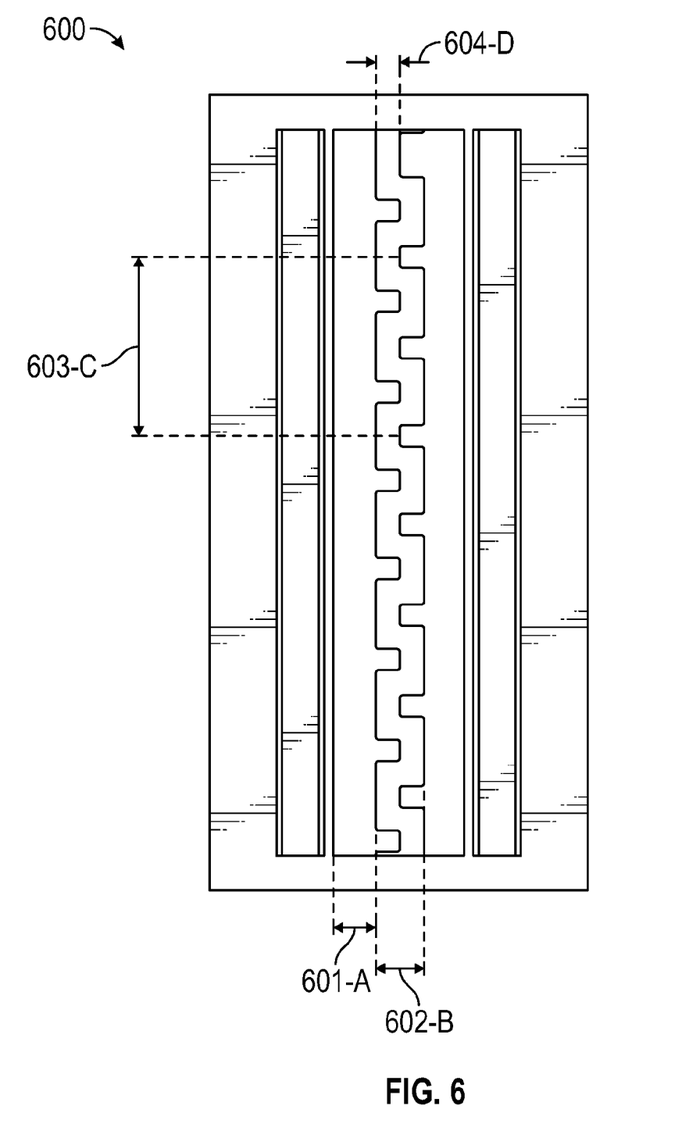
FIG. 6 is an illustration of a serpentine mutual inductance suppressor according to an embodiment.

FIG. 6 is an illustration of a serpentine mutual inductance suppressor according to an embodiment. In some embodiments, a serpentine inductance suppressor includes a serpentine path of the voltage reference plane between a first conductor and a second conductor.

In some embodiments, the Lm suppressor is formed by the generation of voids in the voltage reference plane, the Lm suppressor being a serpentine path defined by the voltage reference plane voids. In some embodiments, the Lm suppressor is alternatively introduced on the voltage reference plane, for example a solid serpentine deposited on top of (or build up upon) the reference plane, and thus reference plane voiding may not be present.

A serpentine inductance suppressor may be viewed as including a first voltage reference plane void in the voltage reference plane near or adjacent to a first conductor and a second voltage reference plane void in the voltage reference plane near or adjacent to a second conductor, the first voltage reference plane void and the second voltage reference plane void forming an alternating (or serpentine) path for the voltage reference plane between the first voltage reference plane void and second voltage reference plane void.

Stated in another way, the first voltage reference plane void includes a first series of notches, the first series of notches being aligned towards the second voltage reference plane void, and the second voltage reference plane void includes a second series of notches, the second series of notches being aligned towards the first voltage reference plane void. In some embodiments, the first series of notches and second series of notches are aligned alternately, such in the direction of the notches the notches of the first series do not align with the notches of the second series. In some embodiments, the notches are sufficient length that in the direction perpendicular to the length of the notches the first series either align with or overlap the notches of the second series.

In some embodiments, a serpentine parameter, including but not limited to illustrated parameters 601-604, will alter the resulting operation of the voltage reference plane structure. The serpentine parameters including, but not limited to, 601 to 604, will alter the attributes of the structure. The parameters illustrated are A 601 (Voltage reference plane void size, i.e., a width of the voltage reference plane void excluding the notches); B 602 (Serpentine trace size, i.e., a distance between the first voltage reference plane and the second voltage reference plane); C 603 (Serpentine turns, i.e. the number of turns based on a wavelength of the serpentine trace pattern); and D 604 (Serpentine trace width, i.e., a distance between the end of a notch of one voltage reference plane void to the body of the other voltage reference plane void).

Changing L0 and Cg will affect the line characteristic impedance as described by equations [5] and [6]. Therefore, Lm-suppressor structure may not encroach the area directly beneath the signal lines, as this would alter the electromagnetic field between the signal and voltage reference plane, subsequently affecting the L0 and Cg, and changes the line characteristic impedance.

Figure 7:
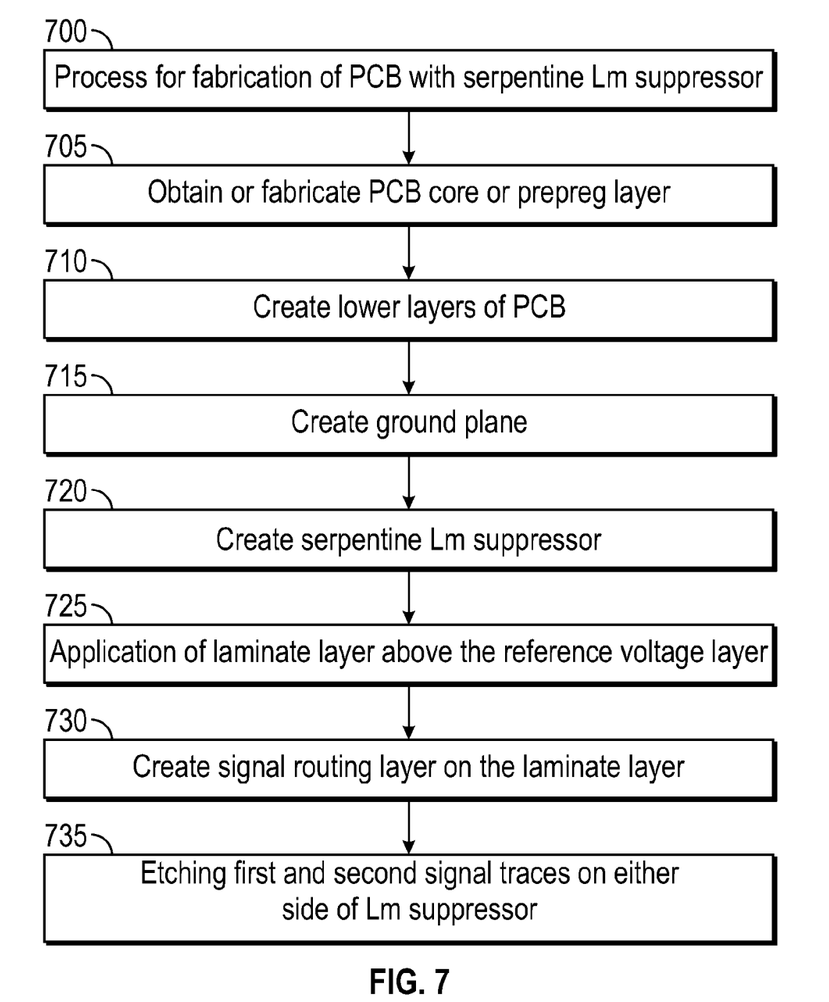
FIG. 7 is an illustration of a process for fabrication of a printed circuit board with mutual inductance suppressor according to an embodiment.

FIG. 7 is an illustration of a process for fabrication of a printed circuit board with mutual inductance suppressor according to an embodiment. In some embodiments, a process 700 includes the following:

705: Obtain or fabricate PCB core or prepreg layer example with FR4 epoxy resin based material.

710: Create lower layers of the PCB.

715: Create voltage reference plane (for example a place associated with a ground potential or a supply voltage potential) for the PCB.

720: Create serpentine Lm suppressor on the voltage reference plane. In some embodiments, the Lm suppressor is generated by etching a first voltage reference plane void and a second voltage reference plane void to generate an Lm suppressor in the voltage reference plane, the Lm suppressor including a serpentine path of the voltage reference plane between the first voltage reference plane void and the second voltage reference plane void. In some embodiments, the Lm suppressor is alternatively introduced on the voltage reference plane, for example a solid serpentine deposited on top of (or build up upon) the reference plane, and thus reference plane voiding may not be present.

725: Application of a laminate layer above the reference voltage plane.

730: Creation of a signal routing layer on the laminate layer.

735: Etching the first and second signal traces on either side of the Lm suppressor on the signal routing layer through, for example, a subtractive metallization process.

Figure 8:
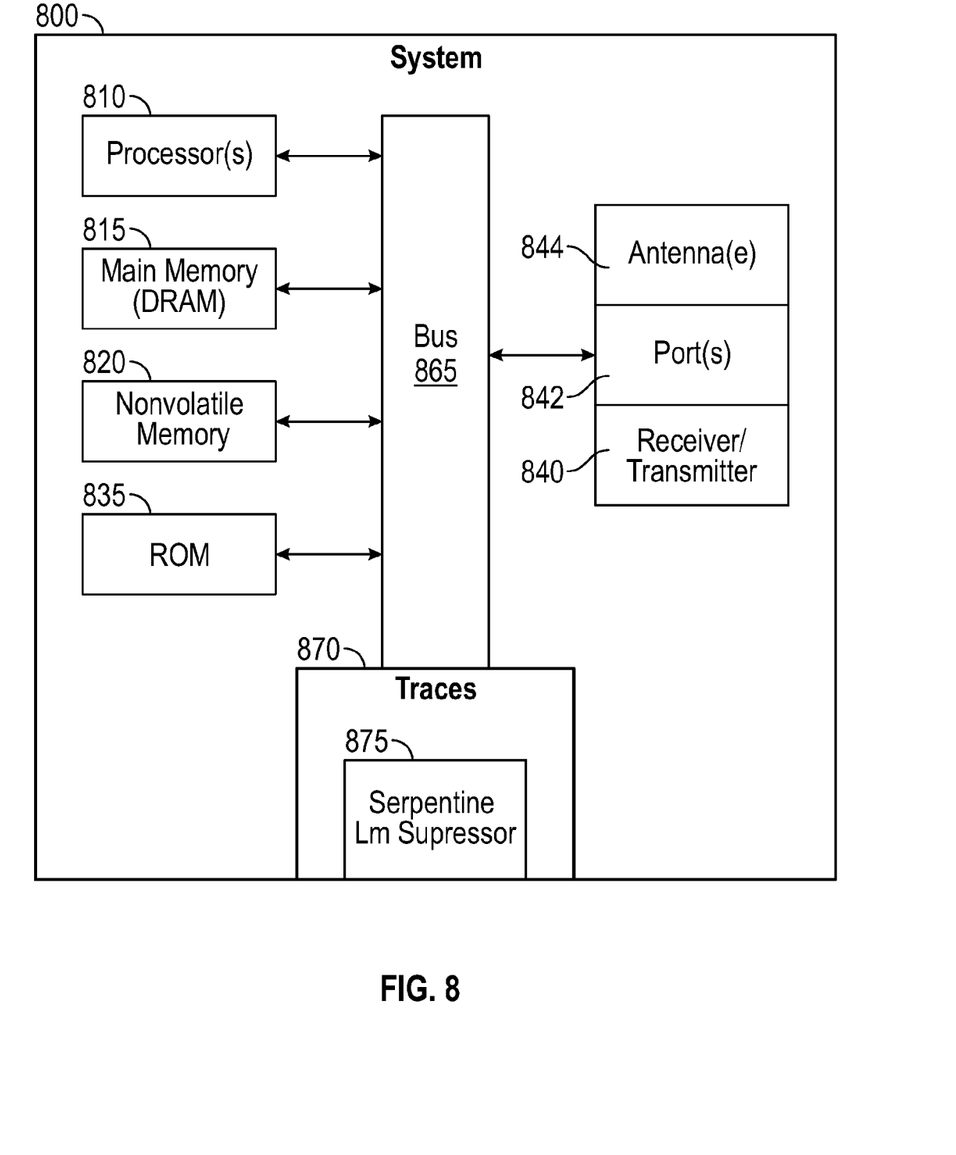
FIG. 8 is an illustration of a system including a printed circuit board with mutual inductance suppressor according to an embodiment.

FIG. 8 is an illustration of a system including a printed circuit board including mutual inductance suppressor according to an embodiment. In this illustration, certain standard and well-known components that are not germane to the present description are not shown. In some embodiments, a system 800 includes a bus 865, the bus being a communication means for transmission of data. The bus 865 is illustrated as a single bus for simplicity, but may represent multiple different interconnects or buses and the component connections to such interconnects or buses may vary. The bus 865 shown in FIG. 8 is an abstraction that represents any one or more separate physical buses, point-to-point connections, or both connected by appropriate bridges, adapters, or controllers.

In particular, the bus 865 includes traces 870 for the carrying of signals, wherein at least a pair of traces includes a serpentine mutual inductance suppressor 875. The mutual inductance suppressor 875 may be as illustrated in FIGS. 2A and 2B. In some embodiments, the further inductance suppressor may be implemented in a conventional solid PCB, a flexible printed circuit board (FPC), or a flexible printed cable.

In some embodiments, the system 800 further includes a processing means such as one or more processors 810 coupled to the bus 865. The processors 810 may comprise one or more physical processors and one or more logical processors. In some embodiments, the processors may include one or more general-purpose processors or special-processor processors.

In some embodiments, the system 800 further comprises a random access memory (RAM) or other dynamic storage device or element as a main memory 815 for storing information and instructions to be executed by the processors 810. Main memory 815 may include, but is not limited to, dynamic random access memory (DRAM).

The system 800 also may comprise a non-volatile memory 820; and a read only memory (ROM) 835 or other static storage device for storing static information and instructions for the processors 810.

In some embodiments, the system 600 includes one or more transmitters or receivers 840 coupled to the bus 865. In some embodiments, the system 800 may include one or more antennae 844 (internally or externally), such as dipole or monopole antennae, for the transmission and reception of data via wireless communication using a wireless transmitter, receiver, or both, and one or more ports 842 for the transmission and reception of data via wired communications. Wireless communication includes, but is not limited to, Wi-Fi, Bluetooth™, near field communication, and other wireless communication standards.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a printed circuit board a first signal trace and a second signal trace on a first layer, wherein the first signal trace and second signal trace are non-intersecting; a second layer below the first layer, the second layer including a voltage reference plane; and a mutual inductance suppressor in the voltage reference plane, the mutual inductance suppressor including a serpentine portion of the voltage reference plane between the first signal trace and the second signal trace.

In some embodiments, the mutual inductance suppressor is defined by a first void and a second void in the voltage reference plane between the first signal trace and the second signal trace.

In some embodiments, the first void is nearer to the first signal trace than the second signal trace, and wherein the second void is nearer to the second signal trace than the first signal trace.

In some embodiments, the first void includes a first plurality of notches and the second void includes a second plurality of notches, the first plurality of notches being aligned towards the second void and the second plurality of notches being aligned towards the first void.

In some embodiments, the first plurality of notches and the second plurality of notches are alternating.

In some embodiments, the mutual inductance suppressor is a structure on the voltage reference plane.

In some embodiments, the mutual inductance suppressor is one of a structure that is placed on the voltage reference plane or a structure that is built up on voltage reference plane.

In some embodiments, the mutual inductance suppressor provides a mutual inductance between the first signal trace and the second signal trace that is lower in comparison with a voltage reference plane without a mutual inductance suppressor.

In some embodiments, a method for fabrication of a circuit board includes fabricating a first layer including a voltage reference plane on a first layer; and fabricating a first signal trace and a second signal trace on a second layer, wherein the first signal trace and second signal trace are non-intersecting, wherein fabricating the first layer including the voltage reference plane includes fabricating a mutual inductance suppressor in the voltage reference plane, the mutual inductance suppressor including a serpentine portion of the voltage reference plane between the first signal trace and the second signal trace.

In some embodiments, the mutual inductance suppressor is defined by a first void and a second void in the voltage reference plane between the first signal trace and the second signal trace.

In some embodiments, the first void is nearer to the first signal trace than the second signal trace, and wherein the second void is nearer to the second signal trace than the first signal trace.

In some embodiments, fabricating the first void and the second void include forming a first plurality of notches in the first void and a second plurality of notches in the second void, the first plurality of notches being aligned towards the second void and the second plurality of notches being aligned towards the first void.

In some embodiments, the first plurality of notches and the second plurality of notches are alternating.

In some embodiments, the method further includes forming the mutual inductance suppressor on the voltage reference plane.

In some embodiments, forming the mutual inductance suppressor includes one of placing the mutual inductance suppressor on the voltage reference plane or building up the mutual inductance suppressor on voltage reference plane.

In some embodiments, the mutual inductance suppressor provides a mutual inductance between the first signal trace and the second signal trace that is lower in comparison with a voltage reference plane without a mutual inductance suppressor.

In some embodiments, a system includes a processing element for the processing of data; a memory for the storage of data; a transmitter or receiver and one or more antennae for the transmission or reception of data; and a printed circuit board including a first signal trace and a second signal trace on a first layer, wherein the first signal trace and second signal trace are non-intersecting; a second layer below the first layer, the second layer including a voltage reference plane; and a mutual inductance suppressor in the voltage reference plane, the mutual inductance suppressor including a serpentine portion of the voltage reference plane between the first signal trace and the second signal trace.

In some embodiments, the mutual inductance suppressor is defined by a first void and a second void in the voltage reference plane between the first signal trace and the second signal trace.

In some embodiments, the first void is nearer to the first signal trace than the second signal trace, and wherein the second void is nearer to the second signal trace than the first signal trace.

In some embodiments, the first void includes a first plurality of notches and the second void includes a second plurality of notches, the first plurality of notches being aligned towards the second void and the second plurality of notches being aligned towards the first void.

In some embodiments, the first plurality of notches and the second plurality of notches are alternating.

In some embodiments, the mutual inductance suppressor is a structure on the voltage reference plane.

In some embodiments, the mutual inductance suppressor is one of a structure that is placed on the voltage reference plane or a structure that is built up on voltage reference plane.

In some embodiments, the mutual inductance suppressor provides a mutual inductance between the first signal trace and the second signal trace that is lower in comparison with a voltage reference plane without a mutual inductance suppressor.

In some embodiments, the printed circuit board is a flexible printed circuit board (FPC).

What is claimed is:

1. A printed circuit board comprising:
    a first signal trace and a second signal trace on a first layer, wherein the first signal trace and second signal trace are non-intersecting;
    a second layer below the first layer, the second layer including a voltage reference plane; and
    a mutual inductance suppressor in the voltage reference plane, the mutual inductance suppressor including a serpentine portion of the voltage reference plane between the first signal trace and the second signal trace, the serpentine portion non-overlapping with the first signal trace and non-overlapping with the second signal trace from a plan view perspective.

2. The board of claim 1, wherein the mutual inductance suppressor is defined by a first void and a second void in the voltage reference plane between the first signal trace and the second signal trace.

3. The board of claim 2, wherein the first void is nearer to the first signal trace than the second signal trace, and wherein the second void is nearer to the second signal trace than the first signal trace.

4. The board of claim 2, wherein the first void includes a first plurality of notches and the second void includes a second plurality of notches, the first plurality of notches being aligned towards the second void and the second plurality of notches being aligned towards the first void.

5. The board of claim 4, wherein the first plurality of notches and the second plurality of notches are alternating.

6. The board of claim 1, wherein the mutual inductance suppressor is a structure on the voltage reference plane.

7. The board of claim 6, wherein the mutual inductance suppressor is one of a structure that is placed on the voltage reference plane or a structure that is built up on voltage reference plane.

8. The board of claim 1, wherein the mutual inductance suppressor provides a mutual inductance between the first signal trace and the second signal trace that is lower in comparison with a voltage reference plane without a mutual inductance suppressor.

9. A method for fabrication of a circuit board comprising:
fabricating a first layer including a voltage reference plane on a first layer; and
fabricating a first signal trace and a second signal trace on a second layer, wherein the first signal trace and second signal trace are non-intersecting; wherein fabricating the first layer including the voltage reference plane includes fabricating a mutual inductance suppressor in the voltage reference plane, the mutual inductance suppressor including a serpentine portion of the voltage reference plane between the first signal trace and the second signal trace, the serpentine portion non-overlapping with the first signal trace and non-overlapping with the second signal trace from a plan view perspective.

10. The method of claim 9, wherein the mutual inductance suppressor is defined by a first void and a second void in the voltage reference plane between the first signal trace and the second signal trace.

11. The method of claim 10, wherein the first void is nearer to the first signal trace than the second signal trace, and wherein the second void is nearer to the second signal trace than the first signal trace.

12. The method of claim 10, wherein fabricating the first void and the second void include forming a first plurality of notches in the first void and a second plurality of notches in the second void, the first plurality of notches being aligned towards the second void and the second plurality of notches being aligned towards the first void.

13. The method of claim 12, wherein the first plurality of notches and the second plurality of notches are alternating.

14. The method of claim 10, further comprising forming the mutual inductance suppressor on the voltage reference plane.

15. The method of claim 14, wherein forming the mutual inductance suppressor includes one of placing the mutual inductance suppressor on the voltage reference plane or building up the mutual inductance suppressor on voltage reference plane.

16. The method of claim 10, wherein the mutual inductance suppressor provides a mutual inductance between the first signal trace and the second signal trace that is lower in comparison with a voltage reference plane without a mutual inductance suppressor.

17. A system comprising:
a processing element for the processing of data;
a memory for the storage of data;
a transmitter or receiver and one or more antennae for the transmission or reception of data; and
a printed circuit board including:
a first signal trace and a second signal trace on a first layer, wherein the first signal trace and second signal trace are non-intersecting;
a second layer below the first layer, the second layer including a voltage reference plane; and
a mutual inductance suppressor in the voltage reference plane, the mutual inductance suppressor including a serpentine portion of the voltage reference plane between the first signal trace and the second signal trace, the serpentine portion non-overlapping with the first signal trace and non-overlapping with the second signal trace from a plan view perspective.

18. The system of claim 17, wherein the mutual inductance suppressor is defined by a first void and a second void in the voltage reference plane between the first signal trace and the second signal trace.

19. The system of claim 18, wherein the first void is nearer to the first signal trace than the second signal trace, and wherein the second void is nearer to the second signal trace than the first signal trace.

20. The system of claim 18, wherein the first void includes a first plurality of notches and the second void includes a second plurality of notches, the first plurality of notches being aligned towards the second void and the second plurality of notches being aligned towards the first void.

21. The system of claim 20, wherein the first plurality of notches and the second plurality of notches are alternating.

22. The system of claim 17, wherein the mutual inductance suppressor is a structure on the voltage reference plane.

23. The system of claim 22, wherein the mutual inductance suppressor is one of a structure that is placed on the voltage reference plane or a structure that is built up on voltage reference plane.

24. The system of claim 17, wherein the mutual inductance suppressor provides a mutual inductance between the first signal trace and the second signal trace that is lower in comparison with a voltage reference plane without a mutual inductance suppressor.

25. The system of claim 17, wherein the printed circuit board is a flexible printed circuit board (FPC).

* * * * *